United States Patent
Biesecker et al.

[11] Patent Number: 6,161,443
[45] Date of Patent: Dec. 19, 2000

[54] DRIVE AND ACTUATION MECHANISM FOR A COMPONENT INSERTION MACHINE

[75] Inventors: Douglas A. Biesecker, Clarks Summit; Charles G. Speicher, Brackney, both of Pa.; Lee E. Stephens, Endwell; Gary R. Thomas, Windsor, both of N.Y.

[73] Assignee: Universal Instruments Corporation, Binghamton, N.Y.

[21] Appl. No.: 09/243,848

[22] Filed: Feb. 3, 1999

[51] Int. Cl.⁷ .................................................. F16H 27/02
[52] U.S. Cl. ............................................. 74/89.15; 29/741
[58] Field of Search ........................... 74/89.15, 424.8 R; 29/700, 739, 741

[56] References Cited

U.S. PATENT DOCUMENTS

| | | |
|---|---|---|
| 2,896,213 | 7/1959 | Alderman et al. . |
| 3,488,672 | 1/1970 | Martyn . |
| 3,550,238 | 12/1970 | Allen et al. . |
| 3,594,889 | 7/1971 | Clark . |
| 4,080,730 | 3/1978 | Woodman, Jr. . |
| 4,403,726 | 9/1983 | Snyder et al. ........................ 227/149 |
| 4,464,833 | 8/1984 | Duncan . |
| 4,507,862 | 4/1985 | Kukowski et al. .................... 29/837 |
| 4,553,323 | 11/1985 | Clark . |
| 4,719,810 | 1/1988 | Cyr et al. ............................. 74/89.15 |
| 5,867,893 | 2/1999 | Clark et al. .......................... 29/741 |
| 5,937,699 | 8/1999 | Garrec ................................. 74/89.15 |

FOREIGN PATENT DOCUMENTS

| | | |
|---|---|---|
| 56-28397 | 7/1981 | Japan . |
| 57-21895 | 2/1982 | Japan . |
| 57-54386 | 3/1982 | Japan . |
| 57-124172 | 8/1982 | Japan . |
| 57-42238 | 9/1982 | Japan . |
| 57-55315 | 11/1982 | Japan . |
| 57-60800 | 12/1982 | Japan . |
| 58-9595 | 2/1983 | Japan . |
| 58-53888 | 3/1983 | Japan . |
| 58-116794 | 7/1983 | Japan . |
| 58-175895 | 10/1983 | Japan . |
| 58-175897 | 10/1983 | Japan . |
| 59-229900 | 12/1984 | Japan . |
| 60-64000 | 4/1985 | Japan . |
| 60-18159 | 5/1995 | Japan . |

*Primary Examiner*—David Fenstermacher
*Attorney, Agent, or Firm*—Orrick, Herrington & Sutcliffe LLP

[57] ABSTRACT

A drive and actuation mechanism for a component insertion machine having a lead screw mounted to a housing by a ball nut and a spline nut so as to be movable longitudinally and rotationally. The lead screw has a hollow shaft in which a push rod is disposed. An arm support is mounted to the lead screw so as to move vertically with the lead screw. An actuation arm is connected at a first bearing point to the push rod and connected at a second bearing point to the arm support. The actuation arm is driven by a crank motor, which is connected to the actuation arm at a third bearing point, to move the push rod. The ball nut and spline nut are also driven by motors to move the lead screw vertically and rotationally.

19 Claims, 5 Drawing Sheets

6,161,443

DRIVE AND ACTUATION MECHANISM FOR A COMPONENT INSERTION MACHINE

FIELD OF THE INVENTION

The present invention relates to a drive and actuation mechanism for the insertion head of an automatic radial lead electrical component insertion machine.

BACKGROUND OF INVENTION

In the art of automatically inserting radial lead electrical components into a printed circuit board, which is well known in the industry, the components are supplied to the insertion head of the machine in a desired sequence for insertion into the board. In one type of insertion head 12 (illustrated in FIGS. 1A–1C), components 5 are loaded into spring loaded clamps 14 of the insertion head 12 at an elevation above the printed circuit board 2 by a loading mechanism (not shown). To receive the components 5, the insertion head 12 must be precisely located at a predetermined elevation and angularly aligned about its vertical axis with the loading mechanism. After receipt of the component 5 (FIG. 1A), the head 12 is lowered and may be axially rotated to align the component 5 with holes 4 in the printed circuit board 2. As the head 12 is lowered, the spring loaded pusher 16 engages the component 5 and applies force to the top of the component 5. The first part of the insertion stroke is completed when the head 12 is fully down, and the component leads 7 have been inserted into the printed circuit board holes 4 (FIG. 1B).

In the second part of the insertion stroke, the pusher 16 is further lowered by a push rod 80, which moves the spring loaded clamps 14 to an open position and also moves the clamps 14 out from under component 5. The pusher 16 holds the component 5 against the top of the printed circuit board 2 (FIG. 1C) while the inserted leads are cut and clinched on the bottom side of the board. The head 12 is then raised to receive another component 5. During the ascension, the head 12 is aligned to its original position and the pusher 16 is retracted, allowing the clamps 14 to return to their original closed position to receive the next component 5.

The mechanisms used to position and actuate the insertion head 12 in the past have been pneumatically or cam driven. They suffer from either pneumatic delays, excessive wear, complicated linkages or fixed operating profiles.

SUMMARY OF THE INVENTION

It is, therefore, an object of the present invention to provide a high speed servo motor drive and actuation mechanism for the insertion head of a radial lead component insertion machine.

The above and other objects are achieved in accordance with the present invention by a drive and actuation mechanism for a component insertion machine having a housing, a servo motor driven ball nut mounted to the housing and a servo motor driven spline nut mounted to the housing. A lead screw having a helical groove and a number of longitudinal grooves engages the ball nut and spline nut so as to be movable longitudinally and rotationally when driven by the ball nut and spline nut, respectively. The lead screw has a hollow shaft in which a push rod is disposed. An arm support is mounted to the lead screw so as to move only longitudinally with the lead screw. An actuation arm is connected at a first bearing point to the push rod and connected at a second bearing point to the arm support. The actuation arm, at a third bearing point, is connected to, and driven by, a motor by way of a crank arm to move the push rod longitudinally with respect to the lead screw. The ball nut and spline nut are also driven by motors to move the lead screw longitudinally and rotationally.

These and other objects, features and advantages of the present invention will be apparent and fully understood from the following detailed description of the preferred embodiments, taken in connection with the appended drawings.

DETAILED DESCRIPTION OF THE PREFERRED EMBODIMENT

Figure 1C:
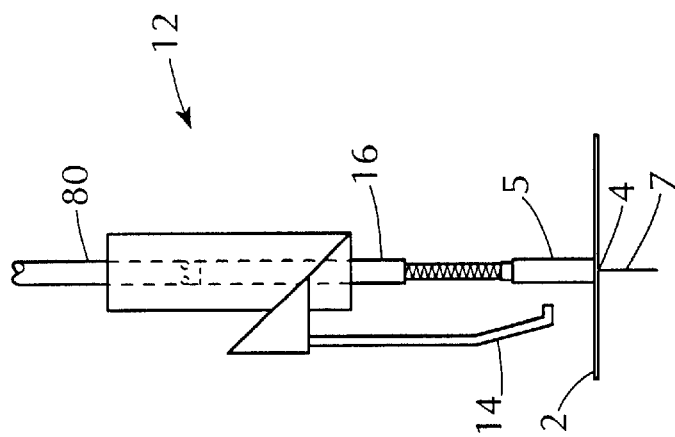
FIG. 1C is a side elevational view of the insertion head of FIG. 1A with the component completely inserted into the circuit board and ejected from the insertion head.

Referring to FIGS. 2, 3, 4 and 5, the drive and actuation mechanism 10 of the present invention is illustrated. The insertion head 12 (described above but not shown in FIG. 2) is mounted to the lower end of a hollow shaft lead screw 50 so as to move with it in the longitudinal (vertical) direction and rotate with it about the lead screw axis. The lead screw 50 has at least one helical groove 56 driven by a ball nut 70 to control vertical movement of the insertion head 12. The lead screw 50 also has at least one spline groove 58, which is driven by a spline nut 60, to control rotation of the insertion head 12. The pusher 16 of the insertion head 12 is driven by a push rod 80, which moves through the hollow center 52 of the lead screw 50. The push rod 80, ball nut 70 and spline nut 60 are each driven by electric servo-motors 130, 110, 120 so that the exact positioning of each may be precisely controlled.

Figure 3:
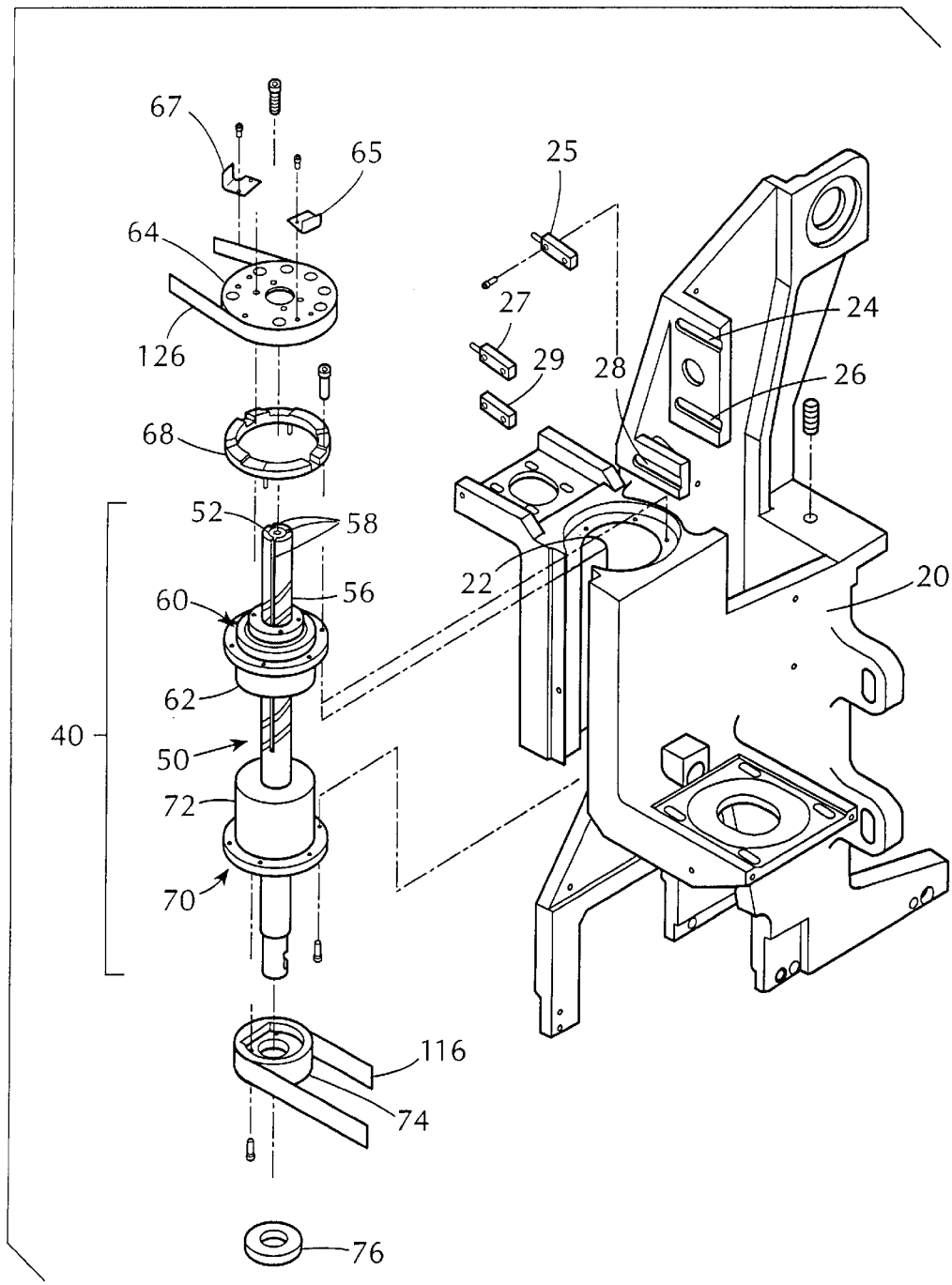
FIG. 3 is an exploded view of the drive assembly of the drive and actuation mechanism of FIG. 2.

Turning to FIG. 3, an exploded view of the drive assembly 40 of the present invention is illustrated. As may be observed, the hollow shaft lead screw 50 has on its exterior both a helical groove 56 and a number of longitudinal grooves running parallel to the axis of the shaft (spline grooves 58). The helical groove 56 is engaged by a ball nut 70 such that rotation of the ball nut 70 causes longitudinal movement of the lead screw 50, and, consequently, vertical movement of the insertion head 12. Above the ball nut 70, a spline nut 60 engages the spline grooves 58 of the lead screw 50 to control the rotational alignment of the lead screw 50 (and insertion head 12), while at the same time allowing for longitudinal movement of the lead screw 50 (and vertical movement of the insertion head 12). Rotation of the spline nut 60 causes rotation of the lead screw 50 about its axis and, conversely, by holding the spline nut 60 in a fixed position, the rotational (angular) alignment of the lead screw 50 will likewise be fixed. The drive assembly 40 of the illustrated embodiment is a Robotte drive assembly available from NSK of Japan, modified to accept the insertion head tooling at the lower end of the lead screw.

The drive assembly 40 is mounted within a drive chamber 22 of the housing 20. The casing 72 of the ball nut 70 is mounted to the bottom of this chamber 22 and the casing 62 of the spline nut 60 is mounted to the top of the chamber 22 by a stop ring 68. Between the ball nut 70 and spline nut 60, the inside diameter of the drive chamber 22 is approximately 40/1000 of an inch larger than the outer diameter of the lead screw 50 and includes a number of longitudinal channels. The drive chamber 22 is sealed by a grease seal block 30 (see FIG. 5) and filled with grease to maintain lubrication of the lead screw 50. Because the inner diameter of the drive chamber 22 is only slightly larger than the outer diameter of the lead screw 50, only a limited amount of grease is required. The channels on the inside of the drive chamber 22 ensure that the grease is distributed along the length of the lead screw 50. A pair of grease fittings 31, 33 extending through the seal block 30 permit re-lubrication of the drive assembly 40 without the need for disassembly.

A drive pulley 74 is mounted to the bottom of the ball nut 70 with the lead screw 50 extending through its center and a drive pulley 64 is similarly mounted to the top of the spline nut 60. In this manner, turning the drive pulley 74 causes the ball nut 70 to rotate about the lead screw 50 and drive it longitudinally, i.e., in the vertical direction. Likewise, turning the drive pulley 64 causes the spline nut 60 to rotate and causes the lead screw 50 to rotate about its axis.

Figures 4, 4A:
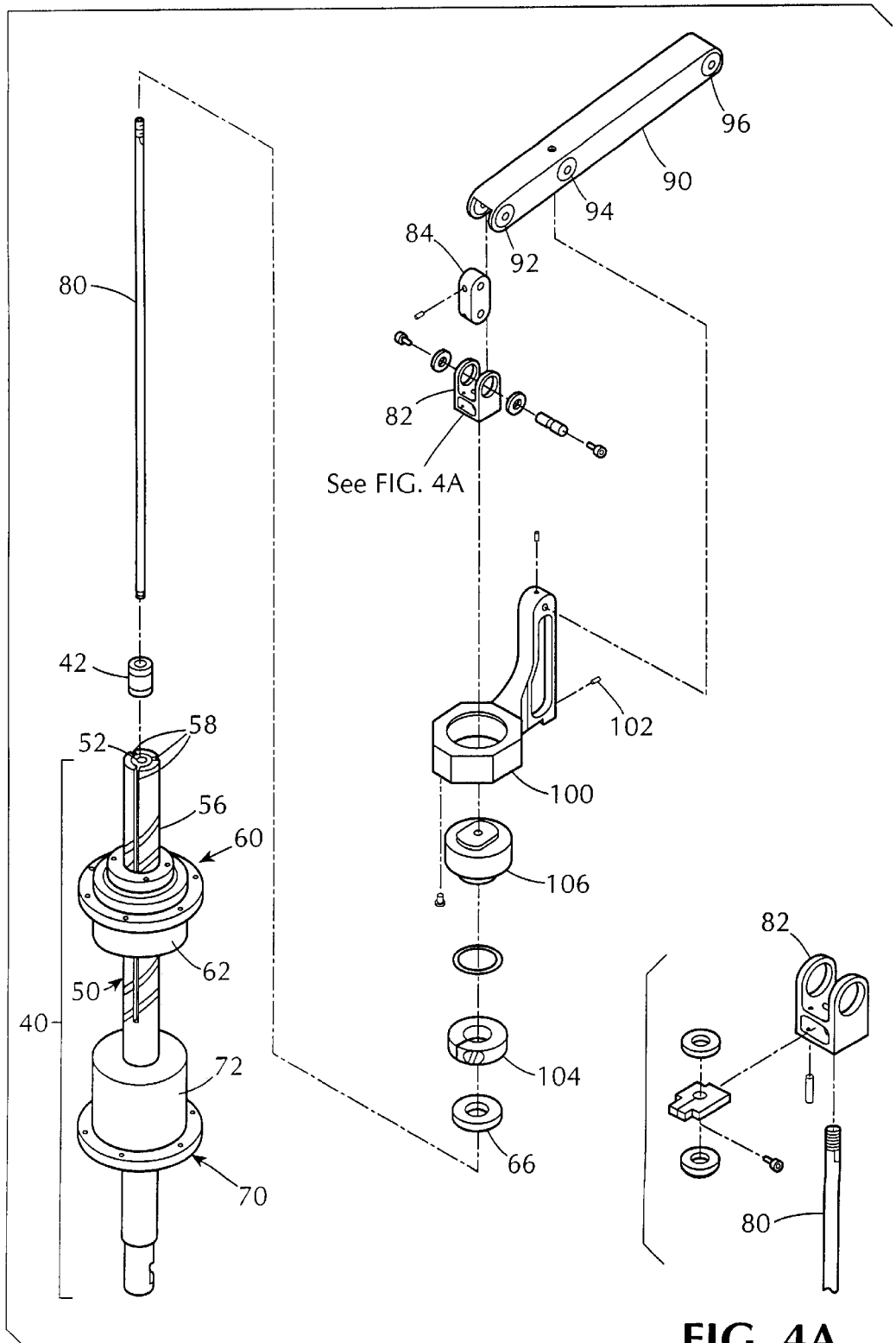
FIGS. 4 and 4(a) is an exploded view of the push rod and actuation arm of the drive and actuation mechanism of FIG. 2.

Referring now to FIG. 4, an exploded view of the push rod 80 mounting and actuation mechanism is illustrated. The push rod 80 is disposed within the hollow center 52 of the lead screw 50 and supported by a ball bushing 42 so that the push rod 80 can move longitudinally (vertically) relative to the lead screw 50. The bottom end 86 of the push rod 80 is attached to the pusher 16 of the insertion head (12 not shown) and provides actuation of the pusher 16. The top end 88 of the push rod 80 is connected by way of a bracket 82 and link 84 to an actuation arm 90. The bracket 82 is secured to the top of the push rod 80 and the link 84 is mounted between the bracket 82 and the left most bearing point 92 of the actuation arm 90. An L-shaped actuation arm support 100 is mounted to the top of the lead screw 50 by a locking clamp 104 and bushing unit 106. The arm support 100 is, therefore, driven vertically with the lead screw 50, but does not rotate with it. The actuation arm 90 is mounted at an inboard bearing point 94 to the top of the arm support 100 in a manner to allow the arm 90 to pivot about the inboard bearing point 94. The push rod 80 may then be driven vertically within the lead screw 50 by rotating the actuation arm 90 about the inboard bearing point 94. The mounting of the arm support 100 to the inboard bearing point 94 of the actuation arm 90 also prevents rotation of the arm support 100 about the lead screw axis.

Figure 5:
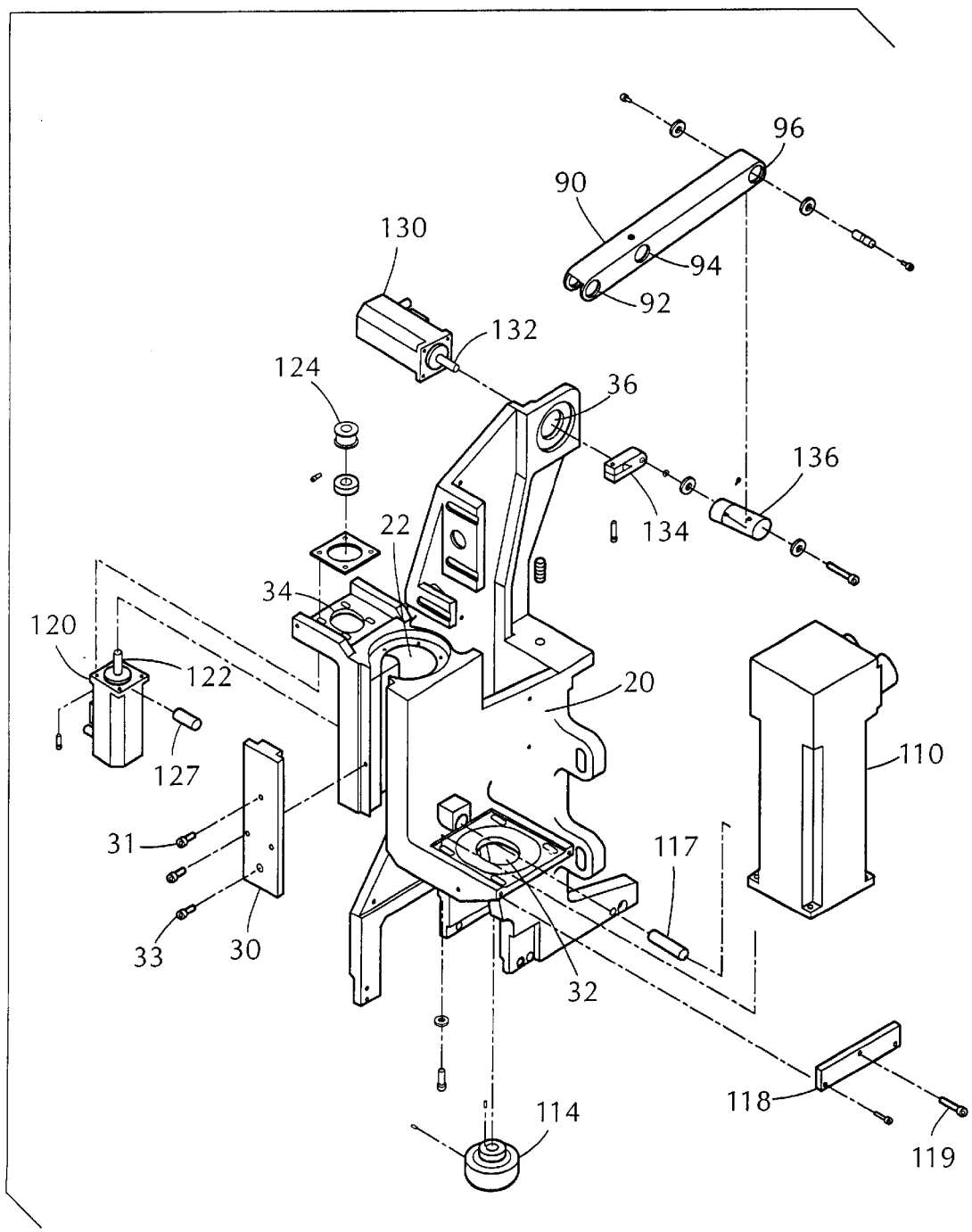
FIG. 5 is an exploded view of the motors of the drive and actuation mechanism of FIG. 2.

FIG. 5 illustrates the mounting of the motors used to drive the mechanism 10 of the present invention. A first drive motor 110, is mounted to the housing 20 adjacent the drive chamber 22. The shaft (not shown) of the drive motor 110 extends through an opening 32 in the housing 20 and a motor pulley 114 is mounted to the shaft. When mounted, the motor pulley 114 is aligned with the drive pulley 74 mounted to the ball nut 70. A timing belt 116 (FIG. 3) connects the two pulleys 114, 74 so that the motor 110 drives the ball nut 70. A spring 117 is positioned between the motor 110 and housing 20, with its axis perpendicular to the lead screw axis. The spring 117 urges the motor 110 in a direction away from the lead screw 50 so as to establish tension on the timing belt 116. When the belt tension is established, the motor 110 is secured to the housing 20. A jack plate 118 and adjustment screw 119 are mounted to the housing 20 on the opposite side of the motor 110 to relieve the tension on the timing belt 116 for assembly and removal of the timing belt 116.

A second drive motor 120, is mounted in a similar manner, with bias spring 127, adjacent the drive chamber 22 opposite drive motor 110. A motor pulley 124 is mounted to the shaft 122 of the drive motor 120, which extends through opening 34 in the housing 20. The motor pulley 124 is aligned with, and connected via a timing belt 126 (FIG. 3) to, the drive pulley 64. The drive motor 120 drives the spline nut 60, and thereby controls the rotation of the lead screw 50 (theta position).

A third motor, motor 130, is mounted to the top of the housing 20, adjacent the actuation arm 90. The shaft 132 of the crank motor 130 extends through an opening 36 in the housing 20 and a crank arm 134 is mounted, in a perpendicular orientation, to the shaft 132. A link 136 is mounted to the crank arm 134 distal end so that the link 136 moves in a circle around the axis of the motor shaft 132. The link 136 is connected to the right most bearing point 96 of the actuation arm 90 so that movement of the link 136 causes the actuation arm 90 to rotate about the inboard bearing point 94 (as previously described) to drive the push rod 80 vertically in the lead screw 50.

In operation, drive motor 110 rotates the ball nut 70 (via timing belt 116) to lower the lead screw 50 and consequently the insertion head 12. At the same time, drive motor 120 may rotate the spline nut 60 (via timing belt 126) to rotate the lead screw 50 and insertion head 12, thereby controlling the angular positioning of the component 5 being placed. Because any rotation of the lead screw 50 by the spline nut 60 causes rotation of the lead screw 50 relative to the ball nut 70, some component of vertical movement is produced by changes in angular position. To compensate for this vertical movement component, drive motor motor 120 are controlled by a computer program designed to take any relative vertical movement of insertion head 12 into account.

Figure 1B:
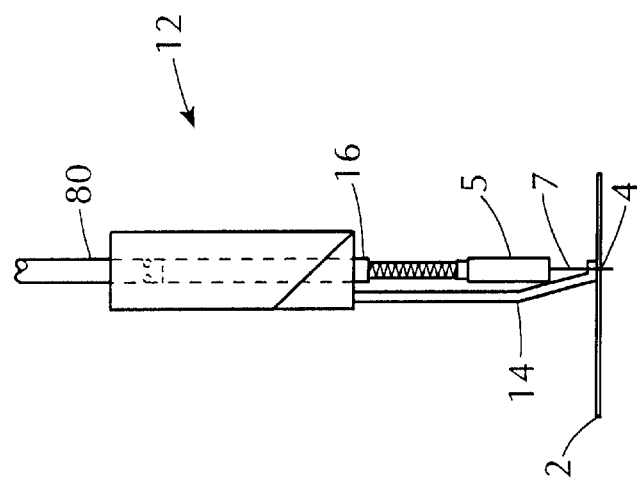
FIG. 1B is a side elevational view of the insertion head of FIG. 1A with the component inserted into the circuit board.
Figure 1A:
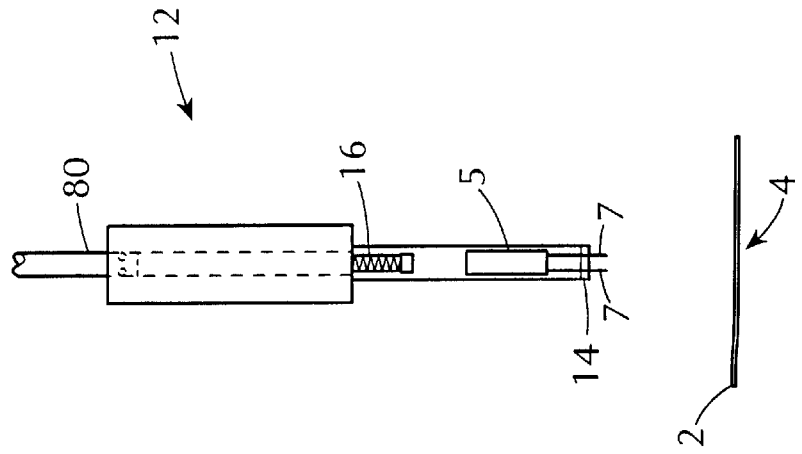
FIG. 1A is a front elevational view of an insertion head of a prior art component insertion machine.
Figure 2:
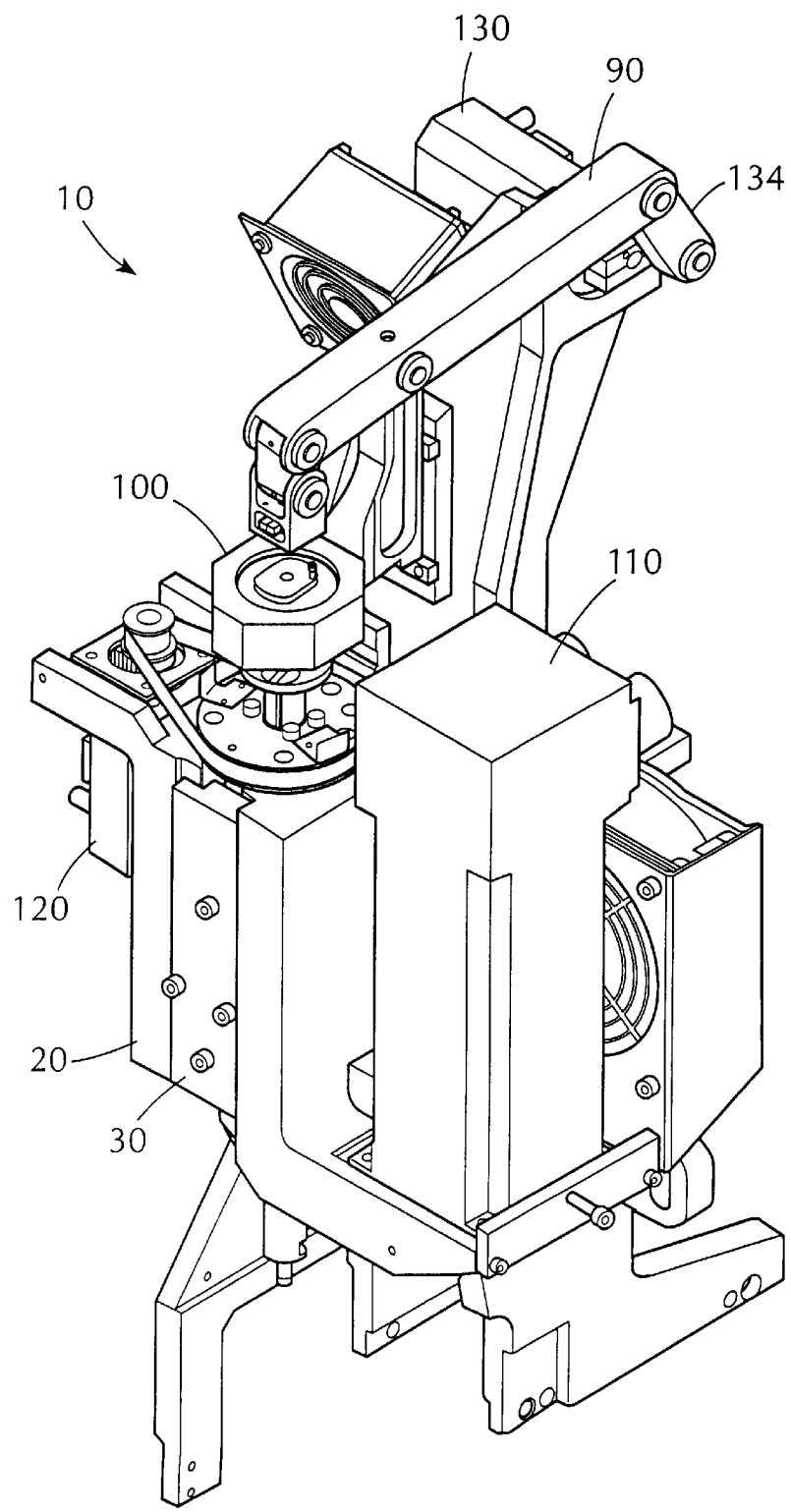
FIG. 2 is a perspective view of a drive and actuation mechanism according to the present invention.

As the lead screw 50 and insertion head 12 move vertically, the arm support 100 moves vertically the same distance. This moves the inboard bearing point 94 of the arm 90 vertically, while the right most bearing point 96 (connected to the link 136) remains stationary. That is, the actuation arm 90 pivots about the rightmost bearing point 96. Because the distance from the rightmost bearing point 96 to the leftmost bearing point 92 is greater than the distance to the inboard bearing point 94, the leftmost bearing point 92 (and push rod 80) moves a greater distance than the inboard bearing point 94 (and lead screw 50). The exact difference in the movement is determined by the ratio of the distances between the three bearing points 92, 94, 96 of the actuation arm 90. This movement causes the pusher 16 to move against the top of component 5, as shown in FIG. 1B, as the insertion head 12 lowers the component 5 to the circuit board 2 in the first part of the insertion stroke.

When the insertion head 12 has reached the circuit board 2, the motor 130 is activated to move the link 136 from a lower position to a higher one. This causes the actuation arm 90 to pivot about the inboard bearing point 94 and, as the rightmost bearing point 96 rises, the leftmost bearing point 92 is lowered. This action drives the push rod 80 down, which drives the pusher 16 down, thereby releasing the spring loaded clamps 14 to the open position and moving the clamps 14 out of the path of the component 5 to complete the second part of the insertion stroke.

The motors 110, 120, 130 of the illustrated embodiment are servo-encoder motors, which operate as conventional servo motors, but also include built-in encoders. Thus the longitudinal and rotational theta movement of the insertion head 12 can be precisely controlled along with the vertical stroke and pusher 16. Acceptable servo-encoder motors are commercially available from Pacific Scientific of Rockford, Ill. or Electrocraft.

The present invention has been described in terms of the illustrated embodiment thereof. Other embodiments, features and variations within the scope of the appended claims will, given the benefit of this disclosure, occur to those having ordinary skill in the art.

What is claimed is:

1. A drive and actuation mechanism for a component insertion machine, said mechanism comprising:
    a housing;
    a lead screw having a hollow shaft, and an exterior having a helical groove and a longitudinal groove mounted to said housing so as to be rotatable and movable in a longitudinal direction;
    a ball nut mounted to said housing, and engaged with said helical groove;
    means to drive said ball nut to cause said lead screw to move longitudinally;
    a spline nut mounted to said housing, and engaged with said longitudinal groove;
    means to drive said spline nut to cause said lead screw to rotate;
    a push rod disposed within said hollow shaft of said lead screw; and
    means to drive said push rod longitudinally in said shaft.

2. The drive and actuation mechanism of claim 1 wherein the means to drive said push rod comprises:
    an arm support mounted to said lead screw;
    an actuation arm connected at a first bearing point to said push rod and connected at a second bearing point to said arm support; and
    means to drive said actuation arm.

3. The drive and actuation mechanism of claim 2 wherein said means to drive said actuation arm comprises a motor connected at a third bearing point to said actuation arm.

4. The drive and actuation mechanism of claim 1 wherein said means to drive said ball nut comprises a first motor connected to said ball nut and wherein said means to drive said spline nut comprises a second motor connected to said spline nut.

5. A drive and actuation mechanism for a component insertion machine, said mechanism comprising:
    a housing;
    a lead screw having a hollow shaft, and an exterior having a helical groove and a longitudinal groove mounted to said housing so as to be rotatable and movable in a longitudinal direction;
    a push rod disposed within said hollow shaft of said lead screw;
    an arm support mounted to said lead screw;
    an actuation arm connected at a first bearing point to said push rod and connected at a second bearing point to said arm support;
    means to longitudinally drive said lead screw;
    means to rotatably drive said lead screw; and
    means to drive said actuation arm.

6. The drive and actuation mechanism of claim 5 wherein said means to longitudinally drive said lead screw comprises:
    a ball nut mounted to said housing, said ball nut engaging said helical groove in said lead screw; and
    a motor connected to said ball nut so as to drive said ball nut.

7. The drive and actuation mechanism of claim 6 wherein said means to rotatably drive said lead screw comprises:
    a spline nut mounted to said housing, said spline nut engaging said longitudinal groove in said lead screw; and
    a motor connected to said spline nut so as to drive said spline nut.

8. The drive and actuation mechanism of claim 5 wherein said means to rotatably drive said lead screw comprises:
    a spline nut mounted to said housing, said spline nut engaging said longitudinal groove in said lead screw; and
    a motor connected to said spline nut so as to drive said spline nut.

9. The drive and actuation mechanism of claim 5 wherein said means to drive said actuation arm comprises a motor connected to a third bearing point on said actuation arm.

10. A method for driving and actuating an insertion head of a component insertion machine including a lead screw having a hollow shaft, and an exterior having a helical groove and a longitudinal groove, mounted to said insertion head; a push rod disposed within said hollow shaft; an arm support mounted to said lead screw; and an actuation arm pivotally mounted to said push rod at a first bearing point and pivotally mounted to said arm support at a second bearing point, said method comprising:
    rotating a ball nut to longitudinally drive said lead screw; and
    rotating a spline nut to rotatably drive said lead screw;
    pivoting said actuation arm about said second bearing point to drive said push rod.

11. The method of claim 10 wherein said step of longitudinally driving said lead screw also causes displacement of said push rod relative to said lead screw.

12. A drive and actuation mechanism for a component insertion machine, said mechanism comprising:
    a housing;
    a lead screw having a hollow shaft, and an exterior having a helical groove and a longitudinal groove, mounted to said housing so as to be rotatable and movable in a longitudinal direction;
    a ball nut mounted to said housing and engaged with said helical groove;
    means to drive said ball nut to cause said lead screw to move longitudinally;
    a spline nut mounted to said housing and engaged with said longitudinal groove;
    means to drive said spline nut to cause said lead screw to rotate;
    a push rod disposed within said hollow shaft of said lead screw; and
    means to drive said push rod longitudinally in said shaft;
    wherein said means to drive said push rod comprises:
        an arm support mounted to said lead screw;
        an actuation arm connected at a first bearing point to said push rod and connected at a second bearing point to said arm support; and means to drive said actuation arm.

13. The drive and actuation mechanism of claim 12 wherein said means to drive said actuation arm comprises a motor connected at a third bearing point to said actuation arm.

14. A drive and actuation mechanism for a component insertion machine, said mechanism comprising:
- a housing;
- a lead screw having a hollow shaft, a helical groove and a longitudinal groove, mounted to said housing so as to be rotatable and movable in a longitudinal direction;
- a ball nut mounted to said housing and engaged with said helical groove;
- means to drive said ball nut to cause said lead screw to move longitudinally;
- a spline nut mounted to said housing and engaged with said longitudinal groove;
- means to drive said spline nut to cause said lead screw to rotate;
- a push rod disposed within said hollow shaft of said lead screw; and
- means to drive said push rod longitudinally in said shaft;
- wherein said means to drive said ball nut comprises a first motor connected to said ball nut and wherein said means to drive said spline nut comprises a second motor connected to said spline nut.

15. A drive and actuation mechanism for a component insertion machine, said mechanism comprising:
- a housing;
- a lead screw having a hollow shaft, and an exterior having a helical groove and a longitudinal groove, mounted to said housing so as to be rotatable and movable in a longitudinal direction;
- a push rod disposed within said hollow shaft of said lead screw;
- an arm support mounted to said lead screw;
- an actuation arm connected at a first bearing point to said push rod and connected at a second bearing point to said arm support;
- means to longitudinally drive said lead screw;
- means to rotatably drive said lead screw; and
- means to drive said actuation arm;
- wherein said means to longitudinally drive said lead screw comprises:
  - a ball nut mounted to said housing, said ball nut engaging said helical groove in said lead screw; and
  - a motor connected to said ball nut so as to drive said ball nut.

16. The drive and actuation mechanism of claim 15 wherein said means to rotatably drive said lead screw comprises:
- a spline nut mounted to said housing, said spline nut engaging said longitudinal groove in said lead screw; and
- a motor connected to said spline nut so as to drive said spline nut.

17. A drive and actuation mechanism for a component insertion machine, said mechanism comprising:
- a housing;
- a lead screw having a hollow shaft, and an exterior having a helical groove and a longitudinal groove, mounted to said housing so as to be rotatable and movable in a longitudinal direction;
- a push rod disposed within said hollow shaft of said lead screw;
- an arm support mounted to said lead screw;
- an actuation arm connected at a first bearing point to said push rod and connected at a second bearing point to said arm support;
- means to longitudinally drive said lead screw;
- means to rotatably drive said lead screw; and
- means to drive said actuation arm;
- wherein said means to rotatably drive said lead screw comprises:
  - a spline nut mounted to said housing, said spline nut engaging said longitudinal groove in said lead screw; and
  - a motor connected to said spline nut so as to drive said spline nut.

18. The drive and actuation mechanism of claim 17 wherein said means to drive said actuation arm comprises a motor connected to a third bearing point on said actuation arm.

19. A method for driving and actuating an insertion head of a component insertion machine including a lead screw having a hollow shaft, and an exterior having a helical groove and a longitudinal groove, mounted to said insertion head; a push rod disposed within said hollow shaft; an arm support mounted to said lead screw; and an actuation arm pivotally mounted to said push rod at a first bearing point and pivotally mounted to said arm support at a second bearing point, said method comprising:
- rotating a ball nut to longitudinally drive said lead screw;
- rotating a spline nut to rotatably drive said lead screw; and
- pivoting said actuation arm about said second bearing point to drive said push rod;
- wherein said step of longitudinally driving said lead screw also causes displacement of said push rod relative to said lead screw.

* * * * *